(12) United States Patent
Song et al.

(10) Patent No.: US 6,303,427 B1
(45) Date of Patent: Oct. 16, 2001

(54) METHOD OF MANUFACTURING A CAPACITOR IN A SEMICONDUCTOR DEVICE

(75) Inventors: Han Sang Song, Kyungki-Do; You Sung Kim, Seoul; Chan Lim, Kyungki-Do; Chang Seo Park, Kyungki-Do; Kyong Min Kim, Kyungki-Do, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/659,508

(22) Filed: Sep. 11, 2000

(30) Foreign Application Priority Data

Sep. 14, 1999 (KR) .................................................. 99-39221

(51) Int. Cl.[7] ...................... H01L 21/336; H01L 21/8242
(52) U.S. Cl. ........................... 438/240; 438/254; 438/197
(58) Field of Search ................................... 438/197, 173, 438/3, 397, 396, 284, 240, 253

(56) References Cited

U.S. PATENT DOCUMENTS

| | | | |
|---|---|---|---|
| 4,448,493 | * 5/1984 | Matsudiara et al. | 252/62.2 |
| 5,189,503 | * 2/1993 | Suguro et al. | 257/310 |
| 5,219,778 | 6/1993 | Dennison et al. | 437/47 |
| 5,298,436 | 3/1994 | Radosevich et al. | 437/29 |
| 5,405,796 | 4/1995 | Jones | 437/47 |
| 5,442,235 | * 8/1995 | Parrillo et al. | 257/758 |
| 5,516,725 | * 5/1996 | Chang et al. | 437/177 |
| 5,552,340 | * 9/1996 | Lee et al. | 437/190 |

* cited by examiner

Primary Examiner—Michael Lebentritt
(74) Attorney, Agent, or Firm—Pennie & Edmonds LLP

(57) ABSTRACT

The present invention relates to a method of manufacturing a capacitor in a semiconductor device. It is designed to solve the problem due to oxidization of the surface of the underlying tungsten electrode during thermal process performed after depositing $Ta_2O_5$ to form a dielectric film in a $Ta_2O_5$ capacitor of a MIM (Metal Insulator Metal) structure using tungsten (W) as an underlying electrode. Thus, the present invention includes forming a good thin $WO_3$ film by processing the surface of the underlying tungsten electrode by low oxidization process before forming a $Ta_2O_5$ dielectric film and then performing deposition and thermal process of $Ta_2O_5$ to form a $Ta_2O_5$ dielectric film. As a good $WO_3$ film is formed on the surface of the underlying tungsten electrode before forming a $Ta_2O_5$ dielectric film, the grain boundary of the tungsten film is filled with oxygen atoms, thus preventing diffusion of oxygen atoms from the $Ta_2O_5$ dielectric film during a subsequent thermal process. Also, as a further oxidization of the surface of the underlying tungsten electrode by the $WO_3$ film could be prevented, thereby improving the characteristic of the leak current of the $Ta_2O_5$ capacitor.

6 Claims, 2 Drawing Sheets

METHOD OF MANUFACTURING A CAPACITOR IN A SEMICONDUCTOR DEVICE

BACKGROUND OF THE INVENTION

1. Field of the Invention

The invention relates generally to a method of manufacturing a capacitor in a semiconductor device, and more particularly to, a method of manufacturing a capacitor in a semiconductor device which can prevent oxidization of the surface of an underlying electrode to improve the characteristic of the leak current of a $Ta_2O_5$ capacitor, upon a thermal treatment process performed after $Ta_2O_5$ is deposited in order to form a dielectric film, in a $Ta_2O_5$ capacitor of a MIM (Metal Insulator Metal) structure using tungsten (W) as an underlying electrode.

2. Description of the Prior Art

Generally, when manufacturing a $Ta_2O_5$ capacitor in a memory device, if metal materials such as Tungsten are used as underlying electrode materials, the work function of the metal materials with poly-silicon is large. Thus, the thickness of the effective oxide film Tox can be reduced and thus the leak current in the thickness of the same effective oxide film can also be reduced. Further, the value of $\Delta C$ depending on the bias voltage is small. As a $Ta_2O_5$ dielectric film lacks oxygen in the film formed by $Ta_2O_5$ deposition process and also contains impurities such as carbon or hydrogen etc., in order to secure the dielectric characteristic of the $Ta_2O_5$ capacitor, oxygen must be flowed into it and a subsequent process for removing impurities must be performed after the $Ta_2O_5$ deposition is completed.

This subsequent process is mainly thermally performed under oxygen atmosphere at a higher temperature, thus securing the dielectric characteristic of a $Ta_2O_5$ dielectric film. However, if the temperature of the thermal process is too high or the time of the thermal treatment is too long, upon thermal treatment process, the surface of the underlying tungsten electrode is oxidized to form a $WO_3$ film. The $WO_3$ film has the dielectric constant of about 42, which is higher than that of $Ta_2O_5$ dielectric film having about 25. However, when creating the $WO_3$ film, there is a possibility that oxygen within the $Ta_2O_5$ dielectric film can be diffused into the underlying tungsten electrode. Also, due to the difference of the thermal expansion coefficient with the $Ta_2O_5$ dielectric film, there is a problem that the characteristic of the leak current of the $Ta_2O_5$ capacitor becomes degraded since a phenomenon of film lifting of the film is generated.

SUMMARY OF THE INVENTION

It is therefore an object of the present invention to provide a method of manufacturing a capacitor in a semiconductor device which can prevent oxidization of the surface of an underlying electrode to improve the characteristic of the leak current of a $Ta_2O_5$ capacitor, upon a thermal treatment process performed after $Ta_2O_5$ is deposited in order to form a dielectric film, in a $Ta_2O_5$ capacitor of a MIM (Metal Insulator Metal) structure using tungsten (W) as an underlying electrode.

In order to accomplish the object, a method of manufacturing a capacitor in a semiconductor device according to the present invention is characterized in that it comprises the steps of forming an underlying tungsten electrode on a substrate in which an underlying structure is formed; forming a $WO_3$ film on the surface of the underlying tungsten electrode; forming a $Ta_2O_5$ dielectric film on the $WO_3$ film; and forming an upper electrode on the $Ta_2O_5$ dielectric film.

BRIEF DESCRIPTION OF THE DRAWINGS

The aforementioned aspects and other features of the present invention will be explained in following description, taken in conjunction with the accompanying drawings, wherein.

DETAILED DESCRIPTION OF PREFERRED EMBODIMENTS

Figure 1A:
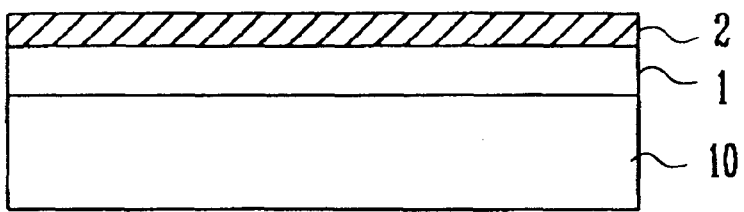
FIGS. 1A through 1D are sectional views for illustrating a method of manufacturing a capacitor in a semiconductor device according to the present invention.

The present invention will be described in detail by way of a preferred embodiment with reference to accompanying drawings, in which like reference numerals are used to identify the same or similar parts.

FIGS. 1A through 1D are sectional views for illustrating a method of manufacturing a capacitor in a semiconductor device according to the present invention.

Referring now to FIG. 1A, a first doped poly-silicon layer 1 is formed on a substrate 10 in which an underlying structure is formed. Then, a barrier metal layer 2 is formed on the first doped poly-silicon layer 1.

In the above, the barrier metal layer 2 is formed of a Ti film and a TiN film. The Ti film is formed by depositing Ti in 100 through 200 Å thickness by means of sputtering method. The TiN film is formed in 100 through 200 Å thickness by means of metal organic chemical vapor deposition (MOCVD) method using $Ti(N(CH_3)_2)_4$(TDMAT) as raw materials and using He and Ar as carrier gases. At this time, the deposition conditions include 200–300 sccm in the flow rate of raw materials; 100 through 300 sccm in the flow rate of He and Ar, respectively, being carrier gases; 2–10 Torr in the pressure within the reactive furnace and 300–500° C. in the temperature within the reactive furnace. Thereafter, a plasma process is performed for about 20 through 50 seconds with the power of 500 through 1000W.

Figure 1B:
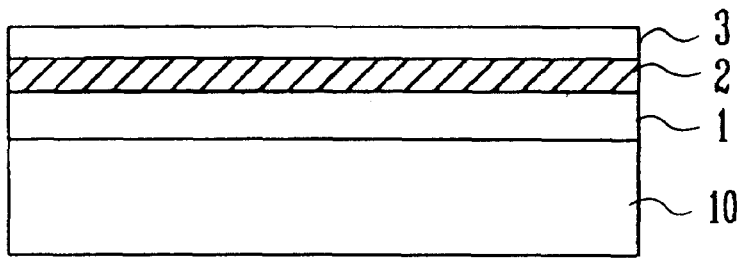

Referring now to FIG. 1B, a tungsten film 3 is formed on the barrier metal layer 2 to complete an underlying electrode.

In the above, the tungsten film 3 is formed by chemical vapor deposition (CVD) method under the conditions that $WF_6$ is used as raw materials, $H_2$ is used as a reactive gas, the pressure within the reactive furnace is maintained at 80–110 Torr, and the temperature within the reactive furnace is maintained at the temperature of 350–450° C.

Figure 1C:
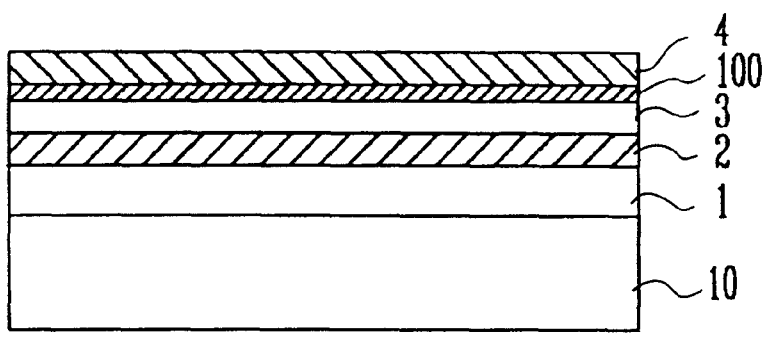

Referring to FIG. 1C, after removing a native oxide film in which impurities created on the surface of the tungsten film 3 are contained by means of cleaning process, a $WO_3$ film 100 is forcedly formed on the surface of the tungsten film 3. Then, a $Ta_2O_5$ dielectric film 4 is formed on the $WO_3$ film 100.

In the above, the cleaning process is performed using 50:1 HF for 30 through 50 seconds. The $WO_3$ film 100 is formed in thickness of 10–30 Å by oxidizing the tungsten film 3 by means of Rapid Thermal Anneal (RTA), plasma process or $UV/O_3$ process etc. under a low temperature oxygen atmosphere. The $WO_3$ film 100 formed thus is good in the quality of the film and also fills the grain boundary of the tungsten film 3 with oxygen atoms. The rapid thermal process is performed under the atmospheres of $O_2$ or $N_2O$ at the temperature of 450–550° C. for 5–20 seconds. The plasma process is performed under the atmospheres of $O_2$ or $N_2O$ at the temperature of 300–550° C. for 30–120 seconds by the power of 200–500W. The $UV/O_3$ process is performed at the temperature of 300 14 550° C. for 2–5 minutes at the strength of 15–30 mW/cm$^2$.

The $Ta_2O_5$ dielectric film 4 is deposited with use $Ta_2O_5$ under the conditions that $Ta(C_2H_5O)_5$ is used as raw materials, $N_2$ gas and $O_2$ gas is used as a carrier gas and an oxidizer, respectively, the flow rate of the $N_2$ gas is maintained at 350–450 sccm, the flow rate of the $O_2$ gas is maintained at 20–50 sccm, the pressure within the reactive furnace is maintained at 0.1–0.6 Torr, and the temperature within the reactive furnace is maintained at 350–450° C. Then, in order to prevent oxidization of the tungsten film 3 being an underlying electrode while obtaining a dielectric characteristic, the $Ta_2O_5$ dielectric film 4 is experienced by a rapid thermal process by mixing inactive gases such as $N_2$, Ar, He etc. in $N_2O$ gas or $O_2$ gas at the temperature of 550–700° C. for 20–60 seconds, or by a plasma annealing process under oxygen atmosphere using $O_2$ gas or $N_2O$ gas by which a plasma power of 10–100W is applied at the temperature of less 350° C.

Figure 1D:
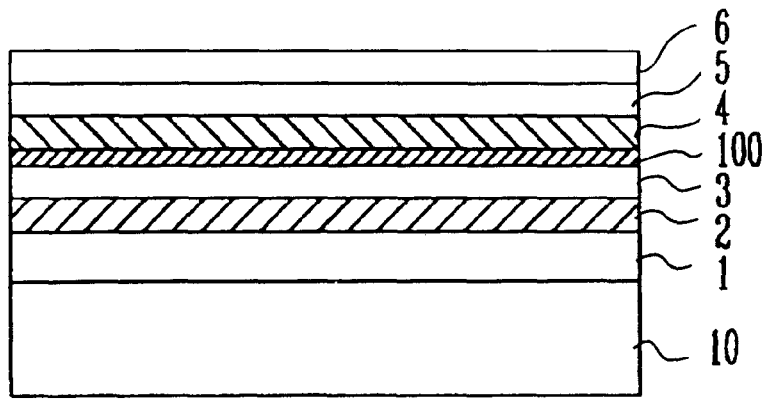

Referring to FIG. 1D, a TiN film 5 and a second doped poly-silicon layer 6 are sequentially formed on the $Ta_2O_5$ dielectric film 4, thus completing an upper electrode of a capacitor. By means of a series of these processes, a $Ta_2O_5$ capacitor of a MIM structure is manufactured.

In the above, the TiN film 5 is formed in thickness of 200–500 Å by means of chemical vapor deposition (CVD) method under the conditions that $TiCl_4$ is used as raw materials, $NH_3$ gas is used as a reactive gas, the temperature within the reactive furnace is maintained at 300–500° C. and the pressure within the reactive furnace is maintained at 0.1–2 Torr. The second poly-silicon layer 6 is formed in thickness of 800–1200 Å. The TiN film 5 functions to reduce the work function with the second poly-silicon layer 6 and the $Ta_2O_5$ dielectric film 4.

Figure 2:
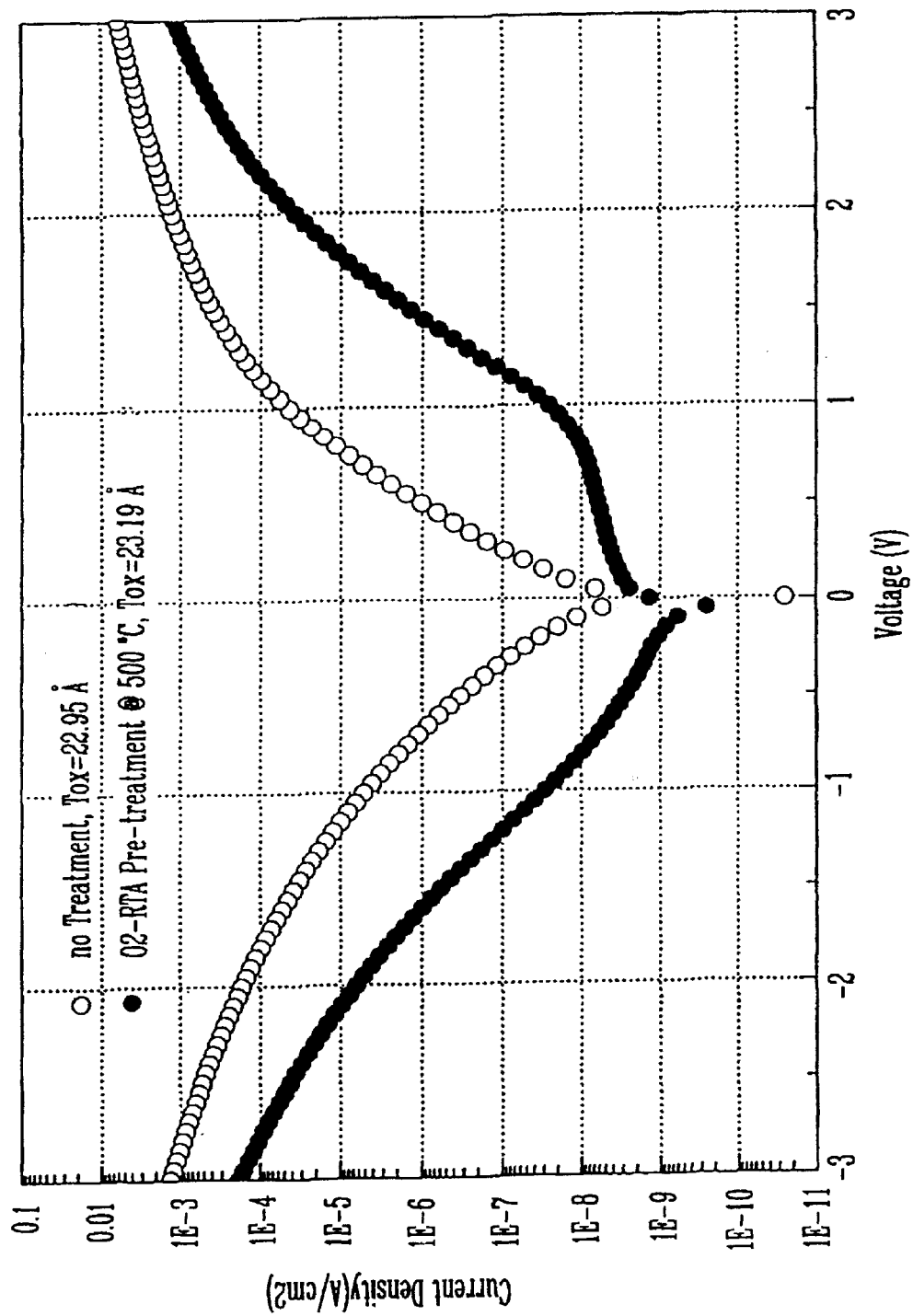
FIG. 2 is a graph of I–V characteristic for showing the leak current characteristic of a capacitor depending on a thermal process under a low temperature oxygen atmosphere before a $Ta_2O_5$ dielectric film is formed.

FIG. 2 is a graph of I–V characteristic for illustrating the leak current characteristic of a capacitor when comparing the method according to the present invention by which $O_2$-RTA is performed at the temperature of 500° C. under the atmosphere of oxygen with the conventional method in which no process is performed before a $Ta_2O_5$ dielectric film is formed.

In order to compare the leak current characteristic, the $Ta_2O_5$ dielectric films in the present invention and the conventional method are formed identically. As shown in FIG. 2, the thickness of the effective oxide film Tox is almost same in both cases of the conventional method and the present invention. However, it could be seen that the leak current in the present invention has been greatly improved. In other words, , the leak current at 1V in the conventional method shows 4.32E-5(A/cm$^2$) while that in the present invention shows 2.58E-8(A/cm$^2$). Also, it could be seen that the leak current in the present invention is greatly improved even in the negative voltage.

As can be understood from the above description with the present invention, the present invention forms a good $WO_3$ film on the surface of the underlying tungsten electrode before forming a $Ta_2O_5$ dielectric film in a $Ta_2O_5$ capacitor using tungsten as an underlying electrode. As the grain boundary of the tungsten film is filled with oxygen atoms, diffusion of oxygen atoms from the $Ta_2O_5$ dielectric film can be prevented during a subsequent thermal process. Thus, the intrinsic characteristic of the $Ta_2O_5$ dielectric film can be intact. Also, a further oxidization of the surface of the underlying tungsten electrode by the $WO_3$ film could be prevented, thereby improving the characteristic of the leak current of the $Ta_2O_5$ capacitor.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a capacitor in a semiconductor device comprising the steps of:

forming an underlying tungsten electrode on a substrate in which an underlying structure is formed;

forming a $WO_3$ film on the surface of the underlying tungsten electrode, wherein said $WO_3$ film is formed in thickness 10–30 Å by processing the surface of the underlying tungsten electrode by an $UV/O_3$ process performed at a temperature of 300–550° C. for 2–5 minutes at a strength of 15–30 mW/cm$^2$;

forming a $Ta_2O_5$ dielectric film on the $WO_3$ film; and forming an upper electrode on the $Ta_2O_5$ dielectric film.

2. The method of manufacturing a capacitor in a semiconductor device according to claim 1, further comprising the step of cleaning using 50:1 HF for 30–50 seconds in order to remove a native oxide film in which impurities created on the surface of the underlying tungsten film are contained, before the $WO_3$ film is formed.

3. A method of manufacturing a capacitor in a semiconductor device comprising the steps of:

forming an underlying tungsten electrode on a substrate in which an underlying structure is formed;

forming a $WO_3$ film on the surface of the underlying tungsten electrode using an $UV/O_3$ process, wherein said $UV/O_3$ process is performed at a temperature of 300–550° C. for 2–5 minutes at a strength of 15–30 Mw/cm$^2$;

forming a dielectric film on the $WO_3$ film; and forming an upper electrode on the dielectric film.

4. A method of manufacturing a capacitor in a semiconductor device according to claim 3, further comprising the step of removing a native oxide film from the tungsten electrode prior to forming a $WO_3$ film.

5. A method of manufacturing a semiconductor device according to claim 3, wherein said $WO_3$ film is formed in a thickness of 10–30 Å.

6. A method of manufacturing a semiconductor device according to claim 3 wherein said dielectric film comprises $Ta_2O_5$.

* * * * *